(12) United States Patent
Fransis

(10) Patent No.: US 6,952,141 B1
(45) Date of Patent: Oct. 4, 2005

(54) VCO CONTROL CIRCUIT AND METHOD OF OPERATION

(75) Inventor: Bert L. Fransis, San Diego, CA (US)

(73) Assignee: RF Magic, Inc., San Diego, CA (US)

( * ) Notice: Subject to any disclaimer, the term of this patent is extended or adjusted under 35 U.S.C. 154(b) by 0 days.

(21) Appl. No.: 10/618,448

(22) Filed: Jul. 10, 2003

Related U.S. Application Data

(60) Provisional application No. 60/319,399, filed on Jul. 15, 2002.

(51) Int. Cl.[7] .............................................. H03B 5/12
(52) U.S. Cl. ........................ 331/179; 331/16; 331/1 A
(58) Field of Search ........................ 331/179, 16, 1 A, 331/17, DIG. 2; 327/159, 160, 107

(56) References Cited

U.S. PATENT DOCUMENTS

| | | | |
|---|---|---|---|
| 5,382,921 A | * | 1/1995 | Estrada et al. ............... 331/1 A |
| 5,686,864 A | | 11/1997 | Martin et al. ................ 331/1 A |
| 5,886,582 A | | 3/1999 | Stansell ....................... 331/1 A |
| 6,028,462 A | * | 2/2000 | Kyles .......................... 327/277 |
| 6,147,567 A | | 11/2000 | Welland et al. ............. 331/179 |
| 6,587,007 B2 | * | 7/2003 | Exeter .......................... 331/57 |

* cited by examiner

Primary Examiner—Robert Pascal
Assistant Examiner—Joseph Chang
(74) Attorney, Agent, or Firm—Clifford B. Perry

(57) ABSTRACT

A VCO control circuit includes a variable delay block, a delay counter, and a tuning range selector coupled to one or more tuning circuits, e.g. one or more VCOs, an arrangement of capacitors, varactor diodes, or inductors. The variable delay block receives a reference signal and a delay signal for setting the delay amount applied to the reference signal, and in response outputs a delayed reference signal, whereby two or more different delays may be applied to the reference signal. The delay counter receives the delayed reference signal and an outputs a delay counter output signal in response. The tuning range selector receives the delay counter output signal, and changes the tuning range of the one or more connected tuning circuits in response.

35 Claims, 3 Drawing Sheets

VCO CONTROL CIRCUIT AND METHOD OF OPERATION

CROSS REFERENCE TO RELATED APPLICATIONS

This application claims the benefit of U.S. Provisional Application No. 60/319,399 entitled "Improved VCO Control Circuit," filed Jul. 15, 2002, the contents of which are herein incorporated by reference.

BACKGROUND

The present invention relates to radio frequency circuits and their methods of operations, and more particularly to circuits which control the tuning ranges of VCOs.

Voltage controlled oscillators (VCOs) play an important role in many of today's communications electronics, particularly RF frequency receivers. VCOs are typically used in phase locked loops which allow RF frequency receivers, such as radios, cellular telephones, cable modems, televisions, etc., to receive large amounts data at high speed and with little error. As known in the art and used herein, the term "VCO" applies synonymously to a voltage controlled oscillator circuit, as well as other components, such as capacitors, varactor diodes, and inductors, which can be used with a VCO to control the VCO's tuning range.

As communication bands have broadened (e.g., the television band presently extending from 50 MHz to 890 MHz) it has become necessary to use multiple VCOs to accurately tune to and receive data communicated on these bands. Multiple VCOs have been successfully implemented in phase locked loops to extend the tuning range of receivers in the aforementioned applications.

While multiple VCO systems have been used successfully in various systems, some limitations remain in the VCO control circuitry. One limitation, slow tuning speed, comes as a result of how tuning ranges are selected. Often times in conventional phase locked loop systems, each VCO tuning range is selected and monitored to determine if its selection results in the phase locked loop locking onto the desired frequency. If the selected tuning range does not result in a lock, another tuning range (which may be provided by the same VCO or a separate VCO) is selected and the loop again checked for lock. The process continues for each tuning range, each selection resulting in waiting for the loop to settle in order to determine if a locked condition exits. In a multiple VCO system in which the last tuning range provides lock, the phase locked loop's settling time, and accordingly the receiver's tuning time is slowed considerably. Slow tuning time significantly reduces the performance of a receiver, as channels cannot be changed quickly and receiver tuning can be easily lost. Slow tuning time is especially detrimental in receivers which communicate data using frequency agile modulation techniques, as slow tuning speeds severely reduce or completely prevent operation.

Another limitation in the control circuit of conventional multiple VCO systems, is the lack of variability in delay time needed when checking a selected VCO tuning range for a locked condition. In a phase locked loop, for example, the VCO control circuit activates a VCO to generate a specific tuning range, waits a predetermined period (the phase locked loop's settling time), and monitors the loop for a locked condition. If the control circuit does not detect a locked condition, it controls the tuning circuitry (a VCO, arrangement of capacitors, varactor diodes, inductors) to select another tuning range and repeats the process.

The settling time for phase locked loops are mostly dependent upon the loop's bandwidth, which may vary greatly depending upon the specific application. Narrow band phase locked loops will have relatively long settling time and correspondingly long delay times between VCO activation and lock monitoring, whereas wider band loops will exhibit relatively shorter settling times and require a shorter delay period between VCO activation and lock check. As a consequence of the difference in required delay times, the conventional approach has been to build different phase locked loops for different loop bandwidths. As phase locked loops are highly integrated, it would be more advantageous to build a single system which could be used with application having differing loop bandwidth requirements.

What is therefore needed is an improved VCO control circuit and method of operation which can more quickly select the proper VCO tuning range and which can be broadly used, for instance in applications having different loop bandwidth requirements.

SUMMARY OF THE INVENTION

The present invention now provides systems and methods for a VCO control circuit and method of operation which will enable variability in settling times and faster tuning speeds. In accordance with a first embodiment of the invention, the VCO control circuit includes a variable delay block, a delay counter, and a tuning range selector coupled to one or more tuning circuits, e.g. one or more VCOs, an arrangement of capacitors, varactor diodes, or inductors. The variable delay block receives a reference signal and a delay signal for setting the delay amount applied to the reference signal, and in response outputs a delayed reference signal, whereby two or more different delays may be applied to the reference signal. The delay counter receives the delayed reference signal and an outputs a delay counter output signal in response. The tuning range selector receives the delay counter output signal, and changes the tuning range of the one or more connected tuning circuits in response.

These and other embodiments of the invention will be better understood in view of the following drawings and description.

Figure 1:
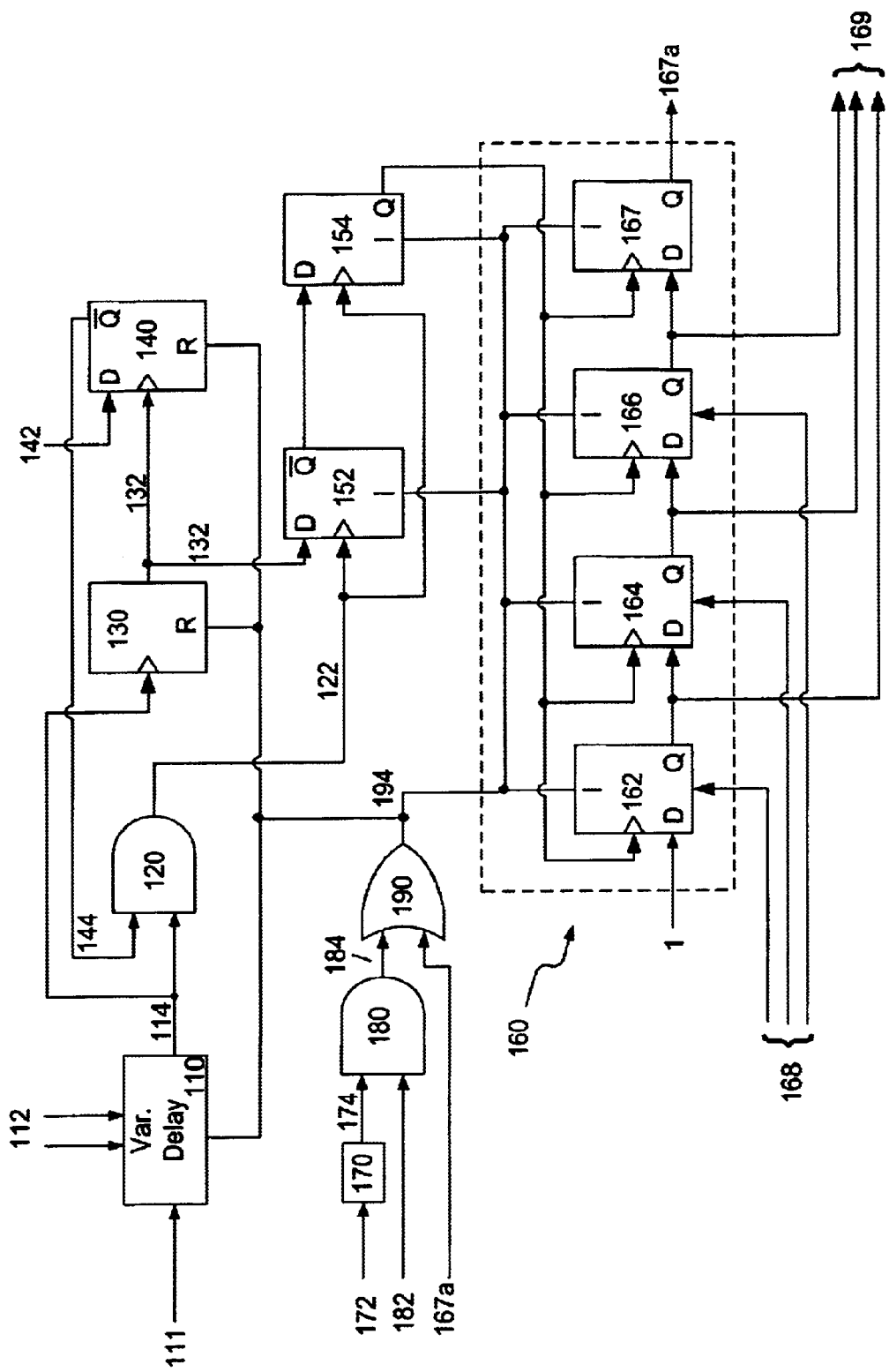
FIG. 1 illustrates a VCO control circuit 100 in accordance with one embodiment of the present invention.

For clarity and convenience, features shown in previous figures retain their reference numerals.

DETAILED DESCRIPTION OF SPECIFIC EMBODIMENTS

FIG. 1 illustrates a VCO control circuit 100 in accordance with one embodiment of the present invention. While the following description is presents the tuning circuit as being a VCO, those skilled in the art will appreciate that the tuning circuitry may alternatively be realized as an arrangement of capacitors, varactor diodes, inductors, or a combination of these components. Further, different tuning ranges may be provided by separate VCOs, by one VCO having different tuning ranges, or a combination of both.

In the illustrated embodiment, the VCO control circuit 100 includes a variable delay block 110, a first AND gate 120, a delay counter 130, lock detect flip-flop 140, flip-flops 152 and 154, a tuning range selector 160 comprising flip flops 162, 164, 166, and 167 collectively configured as a loadable serial shift register 160, logic gate 170, and second AND gate 180, and an OR gate 190. In the preferred embodiment, the aforementioned elements are photolithographically deposited in complementary metal oxide semiconductor (CMOS) material. Of course, other equivalent architectures and/or semiconductor materials may be used in alternative embodiments of the invention During operation, a reference signal $F_{ref}$ 111 is coupled to the variable delay block 110. Variable delay block 110 is configured to provide two or more delay values relative to the reference signal $F_{ref}$ 111. In a specific embodiment, three delay values; x1 (no delay), x2, x4, and a "disable" instruction are provided to the delay block 110 via delay set lines 112. An optimal delay time is selected which is sufficient to permit the phase lock loop to "settle" after a particular tuning range is selected, but which is not so long as to delay the lock detection operation. Different delay times may be selected depending upon the chosen reference frequency, as well as other parameters, such as the loop filter response, phase lock loop settling time, and process variation in the circuit fabrication. Delay values other than those mentioned above may be used in alternative embodiments within the present invention.

When the "disable" delay setting is chosen, the output 114 of the variable delay block 110 is disabled. This process permits tuning range selection through a programming mode, as will be further described below. When one of the other delay settings is chosen, the system operates in an automatic search mode, and a description of this process is now presented.

Automatic Search Mode

When one of the non-disabled delay settings is chosen, the automatic variable delay block 110 outputs a delayed reference signal $dF_{ref}$ 114 to both the AND gate 120 and a delay counter 130. The delay counter 130 is operable to output a pulse after a predefined number of input pulses. In a specific embodiment, the delay counter contains n delay elements and outputs a pulse for every 2n+1 pulses received, although other settings may be chosen in alternative embodiments within the present invention.

Upon receiving the requisite number of input pulses, the delay counter 130 outputs a clock signal 132 to clock flip-flop 140. Upon clocking, flip-flop 140 in turn outputs a feedback signal 144, the feedback signal 144 being the complement to a lock condition signal 142 provided by a lock detection circuit (not shown). The lock condition signal 142 is the result of a digital lock comparison process.

In the instance in which the currently selected tuning range results in a locked condition, the feedback signal 144 is in a low state, which disables the output of the first AND gate 120, and thus terminates the tuning range search process. If an unlocked condition is sensed, the feedback signal 144 is high, enabling the output of the first AND gate 120 and thereby permitting the search process to continue. In the instance in which the feedback signal 142 is high indicating that a locked condition is not sensed, the first AND gate 120 outputs the delay reference signal $dF_{ref}$ 122 as a clock signal to flip-flops 152 and 154. Flip-flip 152 receives the delay counter output 132, and its complementary output is supplied to the data input of flip-flop 154. The output of flip-flop 154 is supplied as clocking signals to serial register flip-flops 162, 164, 166, and 167. Flip-flops 152 and 154 collectively provide the necessary timing to ensure that the clock signal output 122 does not occur before the end of the delay time of the delay counter 130. The output of flip-flop 154 clocks each of the shift register flip-flops 162, 164, 166, and 167 incrementing by one bit the shift register's value after the programmed delay time has elapsed. In the preferred embodiment, the D input port of the flip-flop representing the least significant bit (162 in the illustrated embodiment) is connected to a high state to provide the shift function. Accordingly, the next tuning range is sequentially selected and the circuit begins to count down the program delay time to determine if a high lock signal is received. As described herein, the tuning ranges are provided by tuning circuitry which may consist of VCOs, an arrangement of capacitors, varactor diodes, inductors, and similar components and circuitry. Further, different tuning ranges may be provided by different tuning ranges within one VCO, or a different combination of the aforementioned arrangement of capacitors, varactor diodes, inductors or similar components. The invention is not limited to any specific embodiment of the tuning range circuitry, and any component or circuit which can be used to tune to a predefined frequency may be used in alternative embodiments under the present invention.

When the highest addressable tuning range has been selected, flip-flop 167 outputs a last tuning range select signal 167A from its Q port, that signal being used as an input to the OR gate 190 to continue the selection process. In this manner, the selection process cycles back to the first tuning range, thereby allowing the circuit to lock if an intermittent condition prevents lock during the first selection cycle. A tuning range select word consisting of the output states of flip-flops 162, 164 and 166 are output on tuning range select lines 169.

In the preferred embodiment, the search mode is initiated upon receiving a start signal 172. The start signal is provided to a gate 170, which in response produces a start pulse 174. Additionally, a high state search signal 182 is input to the second AND gate 180 along with the start pulse 174. The resulting signal 184 is supplied with the last tuning range select signal 167A to the OR gate 190. The resulting initialization signal 194 initializes flip-flops 162, 164, 166 and 167 and loads the tuning range select word provided by set lines 168. This input word is provided via set lines 168 and used to select the initial tuning range for phase lock.

In a particular embodiment of the invention, the supplied start signal 172 is also used to initiate other system processes. For example, once the phase locked loop exhibits lock, other initialization pulses may occur which could result in the VCO control circuit switching to another tuning range. Therefore, it is useful to disable the initialization function of the start signal 172 during certain periods. This is accomplished in the illustrated embodiment by applying a low state search signal 182 to the second AND gate. The low state search signal ensures that the initialization signal 184 remains low, and that the flip-flops 162, 164, 166, and 167 remain in their respective states until switched by flip-flop 154.

In the illustrated embodiment the tuning range selector 160 comprises a shift register made up of flip-flops 162, 164, 166 and 167. In an alternative embodiment, the tuning range selector is replaced with a binary counter operating with an ascending or descending binary counts and decode logic applied subsequently thereafter, although other circuits will be apparent to those skilled in the art. The invention is not limited to any specific tuning range selector, and any circuit operable to control the tuning range within connecting tuning circuitry may be used in alternative embodiments under the present invention.

Programmed Tuning Mode

Figure 2:
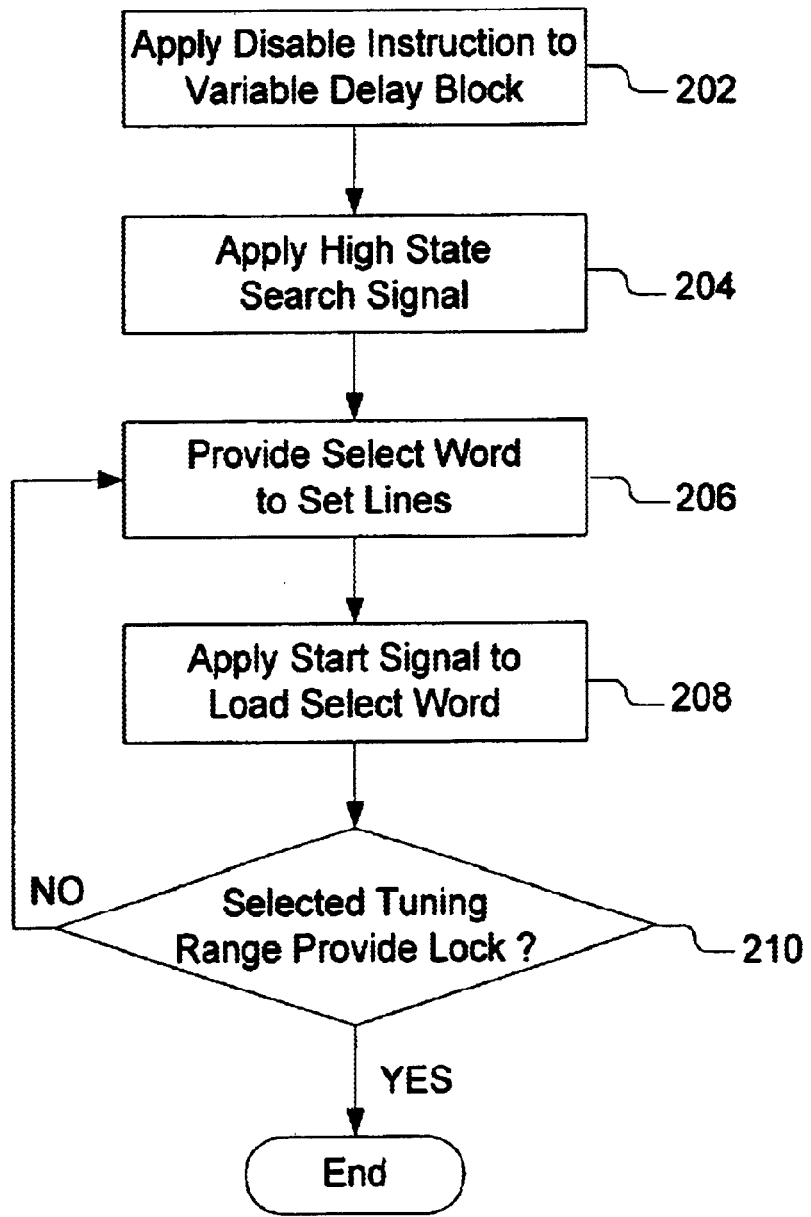
FIG. 2 illustrates a method for programmably selecting a VCO in accordance with one embodiment of the present invention.

The VCO control circuit 100 may also be used to programmably select a particular tuning range. FIG. 2 illustrates one embodiment of this method in accordance with the present invention. As one of skill in the art will appreciate, the invention is not limited to the particular sequence illustrated, and different embodiments within the invention may include the described processes occurring in a different order.

At process 202, a "disable" instruction is applied to delay set lines 112 to disable the output variable delay block 110. This results in the clock signal output of the first AND gate 120 to be disabled. At process 204, a high state search signal 182 is applied to the second AND gate 180. At process 206, a tuning range select word is provided to set lines 168. In a particular embodiment, a microcontroller (not shown) programmably provides the tuning range select word via lines 168. At process 208, a start signal 172 is applied to logic gate 170, the gate 170 producing a start pulse 174, which, in combination with the high state search signal 182, produces a high state signal 184, and in turn produces a high state initialization signal 194. The high state of the initialization signal 194 operates to load flip-flops 162, 164, and 166 with the tuning range select word provided on lines 168. The output word consisting of the output states of flip-flops 162, 164 and 166 is provided via tuning range select lines 169 to select the desired tuning range. In a particular embodiment, tuning range select lines 169 are addressably coupled to a plurality of VCOs. In a further specific embodiment, one or more of these VCOs are operable to provide two or more tuning ranges which can be selected by addressing the VCO in a particular manner. Alternatively, the VCOs may comprise only one tuning range, in which case the desired tuning range is selected by addressably selecting the corresponding VCO. Still alternatively, some of the VCOs may provide two or more of the desired tuning ranges and others provide only one tuning range, each being addressable in the manner as described. In an alternative embodiment, the tuning ranges are provided by differing arrangements of capacitors, varactor diodes, inductors, or similar components, the different arrangements of which are addressably selectable.

At 210, the microcontroller senses the lock condition signal 142, and if a lock condition is detected, the currently selected tuning range provide phase lock, and method terminates. If a locked condition is not detected, the microcontroller programmably provides a second tuning range select word to lines 168, and the aforementioned process repeats. This process may be used to select at least one fewer tuning ranges than are available, the process of which is further described below.

Tuning Range Selection

The VCO control circuit and methods described herein can be used to provide many advantages, one of which is the reduction in the number of tuning ranges which need to be selected to ascertain a locked condition. This reduction results in faster phase locked loop settling time and improved receiver performance.

Figure 3:
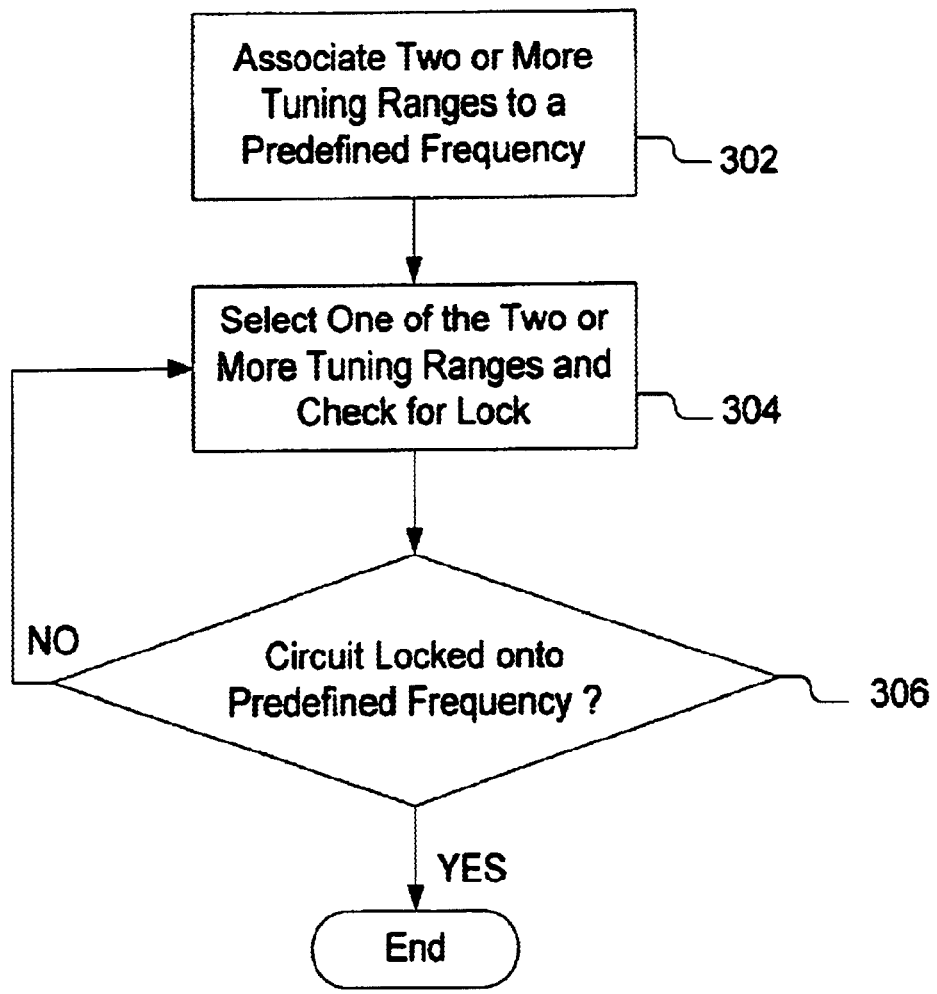
FIG. 3 illustrates a method for operating the improved VCO control circuit shown in FIG. 1 in accordance with one embodiment of the present invention.

FIG. 3 illustrates a method for operating the improved VCO control circuit 100 such that one or more tuning ranges can be eliminated from the selection process. A plurality of separate tuning ranges extend (either spaced apart, adjacent, or in an overlapping manner) over a predefined band, the entire plurality of the tuning ranges consisting of a total number. A subset of that total number of tuning ranges is associated with a predefined frequency at 302, the process of which is further described below. In a particular embodiment in which the total number of tuning ranges is three, the subset consists of two tuning ranges, both tuning ranges being associated with the same frequency, for example, 500 MHz. Of course, the present method is applicable in systems employing a different number of tuning ranges, as long as the subset of tuning ranges is at least one fewer than the total number.

Next at 304, a first of the tuning ranges associated with the predefined frequency is selected from among those within subset, and the tuning circuitry instructed to tune to the predefined frequency within the selected tuning range, described above. The term "first tuning range" is meant to denote the first selected tuning range, not necessarily the lowest or highest tuning range provided thereby. The selection process may be performed as a part of the automatic selection process, or the programmable selection process, each described above. In particular, any method may be used to select a tuning range from the subset of tuning ranges previously identified.

Subsequently at 306, a determination is made as to whether the selected tuning range results in a locked condition, indicating that the predefined frequency has been tuned to. As described above, the process in one embodiment includes activating the tuning circuit to tune to the predefined frequency, waiting a predetermined settling time and detecting a locked or unlocked condition of the phase locked loop. If a locked condition is not indicated, the process repeats 304 and 306 for another of the tuning ranges within the subset. In the above exemplary embodiment, the third tuning range is selected and its lock condition is checked to determine lock. In this manner, only two of the three VCOs are checked for lock, and accordingly the settling time for the phase locked loop is decreased. In the illustrated embodiment of the control circuit shown in FIG. 1 and in the condition in which tuning range selection of all subset tuning ranges does not result in the detection of lock, the processes 304 and 306 continue repeating times in order to permit the phase lock loop to continue its search for a locked condition when the system experiences a temporary unlocked condition.

In a particular embodiment of 302, each tuning range is associated with those frequencies over which it potentially extends in all possible conditions. That is, each tuning range is associated with those frequencies that it will produce or tune to under nominal conditions, and under the widest variation of conditions. For example, it may be known that the tuning range of a VCO will vary ±20% due to variations in the fabrication process or operating conditions. As a result of this variation, the tuning range of the VCO may cover its nominal tuning range, cover a lower tuning range, or cover a higher frequency tuning range. Accordingly, the VCO is associated with those lower, nominal, and higher tuning frequencies. Similarly, adjacent VCOs are associated with their lower, nominal and higher tuning frequencies. As a result, some of the tuning frequencies will overlap tuning ranges, especially adjacent tuning range frequencies, and these tuning frequencies will be included in two or more different tuning ranges. The tuning frequencies of at least one of the VCOs, however, will not extend to overlap with these tuning frequencies, and thus at least one tuning range can be eliminated when attempting to tune to the predefined frequency.

As a particular example of this embodiment, consider a phase lock system consisting of three tuning ranges, each tuning range provided by separate VCOs outputting partially overlapping, but substantially contiguous bands. Variations in the circuit fabrication process, operating temperature, or other effects may tend to shift the VCO output frequency higher or lower in frequency. As a result, a frequency normally output by VCO #1, may after process, temperature, or other variations, result in the VCO #2 outputting that same frequency.

Assuming in one embodiment that the total variation results in less than a 50% shift in the VCO output frequency, the desired output frequency may be generated by one of two neighboring VCOs which output frequencies nearest to the desired frequency. That is, when the process variation is high, VCO #1 may output the desired frequency, and when the variation is low, VCO #2 may output the desired frequency. Accordingly, two VCOs are associated with each frequency, thereby ensuring that each frequency can be generated over the entire spectrum of temperature and process variation. As described above, a first of the two VCOs may be selected and monitored for lock. If a locked condition is not sensed, the second of the two VCOs is then selected. The third VCO is removed from the selection and lock monitoring process for this particular frequency, and the PLL settling time is reduced by one third.

The foregoing description has been presented for purposes of illustration and description. It is not intended to be exhaustive or to limit the invention to the precise form disclosed, and obviously many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A VCO control circuit operable to control the tuning range of one or more tuning circuits, the control circuit comprising:
    a variable delay block having a signal input configured to receive a reference signal, a delay input configured to set the delay amount applied to the reference signal, and an output to provide the delayed reference signal, wherein two or more different delays may be applied to the reference signal;
    a delay counter having an input coupled to receive the delayed reference signal and an output configured to output a delay counter output signal; and
    a tuning range selector having an input coupled to receive the delay counter output signal, and an output coupled to one or more tuning circuits, the tuning range selector operable to control the tuning range of the one or more tuning circuits;
    wherein, upon receiving the delay counter output signal, the output of the tuning range selector changes the tuning range of the one or more tuning circuits.

2. The VCO control circuit of claim 1, wherein the variable delay circuit comprises a no delay setting in which the reference signal is output with no delay.

3. The VCO control circuit of claim 1, wherein the variable delay circuit comprises a disable setting in which the output of the variable delay block is disabled.

4. The VCO control circuit of claim 1, wherein the tuning range selector comprises a shift register.

5. The VCO circuit of claim 4, wherein the shift register includes set lines for programmably selecting one of the plurality of tuning ranges.

6. The VCO control circuit of claim 1, wherein the tuning range selector comprises a counter.

7. The VCO circuit of claim 6, wherein the counter includes set lines for programmably selecting one of the plurality of tuning ranges.

8. The VCO control circuit of claim 1, wherein the one or more tuning circuits comprise one or more VCOs, each VCO configured to provide one or more tuning ranges.

9. The VCO control circuit of claim 1, wherein the one or more tuning circuits comprise one or more capacitors.

10. The VCO circuit of claim 1, wherein the one or more tuning circuits comprise one or more varactor diodes.

11. The VCO circuit of claim 1, wherein the one or more tuning circuits comprise one or more inductors.

12. In a circuit operable to tune to frequencies over a predetermined band, each frequency being located possibly in two or more different tuning ranges and the collection of different tuning ranges making up the predetermined band, a method for selecting which of the tuning ranges to select to tune to a predefined frequency, the method comprising:
    (i) associating two or more of the plurality of tuning ranges with the predefined frequency, wherein the two or more tuning ranges associated with the predefined frequency is at least one fewer tuning ranges than the total number of tuning ranges making up the predetermined band;
    (ii) selecting a first of the two or more tuning ranges to tune to the predefined frequency; and
    (iii) if the presently selected tuning range does not result in the circuit tuning to the predefined frequency, then repeating (ii) by selecting another of the two or more tuning ranges associated with the predefined frequency.

13. The method of claim 12, wherein (ii) comprises selecting a first tuning range provided by a first VCO, and (iii) comprises selecting a second tuning range provided by the first VCO if selection of the first tuning range does not result in the circuit tuning to the predefined frequency.

14. The method of claim 12, wherein (ii) comprises selecting a tuning range provided by a first VCO, and (iii) comprises selecting a tuning range provided by a second VCO if selection of the first tuning range does not result in the circuit tuning to the predefined frequency.

15. The method of claim 12, wherein (i) comprises associating three or more tuning ranges with the predefined frequency,
    wherein (ii) comprises selecting a first tuning range provided by a first VCO,
    wherein (iii) comprises selecting a second tuning range also provided by the first VCO if selection of the first tuning range does not result in the circuit tuning to the predefined frequency, and
    wherein repeating (ii) comprises selecting a third tuning range provided by a second VCO if selection of the second tuning range does not result in the circuit tuning to the predefined frequency.

16. The method of claim 12, wherein (ii) comprises selecting a tuning range provided by a first arrangement of capacitors, and (iii) comprises selecting a tuning range provided by a second arrangement of capacitors if selection of the first tuning range does not result in the circuit tuning to the predefined frequency.

17. The method of claim 12, wherein (ii) comprises selecting a tuning range provided by a first arrangement of varactor diodes, and (iii) comprises selecting a tuning range provided by a second arrangement of varactor diodes if selection of the first tuning range does not result in the circuit tuning to the predefined frequency.

18. The method of claim 12, wherein (ii) comprises selecting a tuning range provided by a first arrangement of inductors, and (iii) comprises selecting a tuning range provided by a second arrangement of inductors if selection of the first tuning range does not result in the circuit tuning to the predefined frequency.

19. The method of claim 12, wherein (ii) comprises programmably selecting one of two or more tuning ranges.

20. The method of claim 12, wherein total number of tuning ranges comprise three tuning ranges, and wherein the two or more tuning ranges comprise two tuning ranges.

21. A computer program product stored on a computer-readable medium for selecting one of a plurality of tuning ranges for tuning to a predefined frequency, the predefined frequency being located possibly in two or more different tuning ranges over which the circuit tunes, the computer program product comprising:
   (i) instruction code to associate two or more of the plurality of tuning ranges with the predefined frequency, wherein the two or more tuning ranges associated with the predefined frequency is at least one fewer tuning ranges than the total number of tuning ranges making up the predetermined band;
   (ii) instruction code to select a first of the two or more tuning ranges to tune to the predefined frequency; and
   (iii) instruction code to repeat (ii) by selecting another of the two or more tuning ranges associated with the predefined frequency if the presently selected tuning range does not result in the circuit tuning to the predefined frequency.

22. The computer program product of claim 21, wherein (ii) comprises instruction code to select a first tuning range provided by a first VCO, and (iii) comprises instruction code to select a second tuning range provided by the first VCO if selection of the first tuning range does not result in the circuit tuning to the predefined frequency.

23. The computer program product of claim 21, wherein (ii) comprises instruction code to select a tuning range provided by a first VCO, and (iii) comprises instruction code to select a tuning range provided by a second VCO if selection of the first tuning range does not result in the circuit tuning to the predefined frequency.

24. The computer program product of claim 21, wherein (i) comprises instruction code to associate three or more tuning ranges with the predefined frequency,
   wherein (ii) comprises instruction code to select a first tuning range provided by a first VCO,
   wherein (iii) comprises instruction code to select a second tuning range also provided by the first VCO if selection of the first tuning range does not result in the circuit tuning to the predefined frequency, and
   wherein repeating (ii) comprises instruction code to select a third tuning range provided by a second VCO if selection of the second turning range does not result in the circuit tuning to the predefined frequency.

25. The computer program product of claim 21, wherein (ii) comprises instruction code to select a tuning range provided by a first arrangement of capacitors, and (iii) comprises instruction code to select a tuning range provided by a second arrangement of capacitors if selection of the first tuning range does not result in the circuit tuning to the predefined frequency.

26. The computer program product of claim 21, wherein (ii) comprises instruction code to select a tuning range provided by a first arrangement of varactor diodes, and (iii) comprises instruction code to select a tuning range provided by a second arrangement of varactor diodes if selection of the first tuning range does not result in the circuit tuning to the predefined frequency.

27. The computer program product of claim 21, wherein (ii) comprises instruction code to select a tuning range provided by a first arrangement of inductors, and (iii) comprises instruction code to select a tuning range provided by a second arrangement of inductors if selection of the first tuning range does not result in the circuit tuning to the predefined frequency.

28. A VCO control circuit comprising:
   variable delay means for receiving a reference signal and for applying a predefined delay to the reference signal, thereby producing a delayed reference signal;
   counter means for receiving the delayed reference signal and for outputting a delay counter output signal; and
   tuning range selection means coupled to one or more tuning means, the tuning means configured to provide one or more tuning ranges, the tuning range selection means for receiving the delay counter output signal, and for changing the tuning range of one or more tuning means.

29. The VCO control circuit of claim 28, wherein the tuning range selector means comprises a shift register.

30. The VCO circuit of claim 29, wherein the shift register includes set lines for programmably selecting one of the plurality of tuning ranges.

31. The VCO control circuit of claim 28, wherein the tuning range selector means comprises a counter.

32. The VCO circuit of claim 31, wherein the counter includes set lines for programmably selecting one of the plurality of tuning ranges.

33. The VCO control circuit of claim 28, wherein the one or more tuning means comprise one or more VCOs, each VCO configured to provide one or more tuning ranges.

34. The VCO control circuit of claim 28, wherein the one or more tuning means comprise one or more capacitors.

35. The VCO circuit of claim 28, wherein the one or more tuning means comprises one or more varactor diodes.

* * * * *